(12) United States Patent
Shin et al.

(10) Patent No.: US 8,796,042 B2
(45) Date of Patent: Aug. 5, 2014

(54) METHOD FOR FORMING MAGNETIC TUNNEL JUNCTION STRUCTURE AND METHOD FOR FORMING MAGNETIC RANDOM ACCESS MEMORY USING THE SAME

(75) Inventors: Hee-Ju Shin, Yongin-si (KR); Jun-Ho Jeong, Suwon-si (KR); Jang-Eun Lee, Suwon-si (KR); Se-Chung Oh, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 6 days.

(21) Appl. No.: 13/286,630

(22) Filed: Nov. 1, 2011

(65) Prior Publication Data
US 2012/0135543 A1 May 31, 2012

(30) Foreign Application Priority Data
Nov. 29, 2010 (KR) .................. 10-2010-0119756

(51) Int. Cl.
*H01L 21/00* (2006.01)
(52) U.S. Cl.
USPC ...................................... 438/3; 257/E43.006
(58) Field of Classification Search
USPC ...................................... 438/3; 257/E43.006
See application file for complete search history.

(56) References Cited

U.S. PATENT DOCUMENTS

| 6,841,484 B2 | 1/2005 | Ying et al. | |
| 2009/0159563 A1* | 6/2009 | Jung | 216/22 |
| 2010/0022030 A1* | 1/2010 | Ditizio | 438/3 |

FOREIGN PATENT DOCUMENTS

| JP | 2005-079258 | * | 3/2005 |
| JP | 2005079258 A | | 3/2005 |
| JP | 2005340260 A | | 12/2005 |

* cited by examiner

*Primary Examiner* — Tony Tran
(74) *Attorney, Agent, or Firm* — Harness, Dickey & Pierce, P.L.C.

(57) ABSTRACT

A method of fabricating a magnetic tunnel junction structure includes forming a magnetic tunnel junction layer on a substrate. A mask pattern is formed on a region of the second magnetic layer. A magnetic tunnel junction layer pattern and a sidewall dielectric layer pattern on at least one sidewall of the magnetic tunnel junction layer pattern are formed by performing at least one etch process and at least one oxidation process multiple times. The at least one etch process may include a first etch process to etch a portion of the magnetic tunnel junction layer using an inert gas and the mask pattern to form a first etch product. The at least one oxidation process may include a first oxidation process to oxidize the first etch product attached on an etched side of the magnetic tunnel junction layer.

17 Claims, 7 Drawing Sheets

METHOD FOR FORMING MAGNETIC TUNNEL JUNCTION STRUCTURE AND METHOD FOR FORMING MAGNETIC RANDOM ACCESS MEMORY USING THE SAME

CROSS-REFERENCE TO RELATED APPLICATIONS

This application claims priority to Korean Patent Application No. 10-2010-0119756, filed on Nov. 29, 2010, in the Korean Intellectual Property Office, the entire contents of which is incorporated herein by reference.

BACKGROUND

1. Field

Example embodiments relate to a fabricating method of a magnetic tunnel junction structure and a fabricating method of a magnetic random access memory device using the same.

2. Description of the Prior Art

A MRAM (Magnetic Random Access Memory) device can be written and read in a short period of time, and has non-volatile characteristics. Due to these characteristics, MRAMs have been widely accepted.

Typically, a unit cell of a MRAM device is an element that stores data, and a MTJ (Magnetic Tunnel Junction) pattern is used. A MTJ pattern includes two magnetic layers and a tunnel dielectric layer placed in between the magnetic layers. Thus, a MTJ includes a pinned ferromagnetic layer with a fixed magnetization direction, a free ferromagnetic layer where a magnetization direction can change in parallel or anti-parallel direction, and a tunnel dielectric layer placed in between the pinned ferromagnetic layer and the free ferromagnetic layer.

When etching a magnetic layer using a physical etch to form a magnetic tunnel junction pattern, the conductive product created by the etch is attached to sidewalls of the magnetic tunnel junction pattern, and the magnetic tunnel junction pattern can be shorted due to the conductive etch product attached to the magnetic tunnel junction pattern.

SUMMARY

Example embodiments provide a fabricating method of a magnetic tunnel junction structure and a fabricating method of a MRAM device to prevent or reduce electrical shorts of the magnetic tunnel junction structure with improved resistance characteristics.

According to example embodiments, a fabricating method of a magnetic tunnel junction structure includes forming a magnetic tunnel junction layer by sequentially stacking a first magnetic layer, a tunnel dielectric layer, and a second magnetic layer on a substrate. A mask pattern is formed on a region of the second magnetic layer. A magnetic tunnel junction layer pattern and a sidewall dielectric layer pattern on at least one sidewall of the magnetic tunnel junction layer pattern are formed by performing at least one etch process and at least one oxidation process multiple times. The at least one etch process may include a first etch process to etch a portion of the magnetic tunnel junction layer using an inert gas and the mask pattern to form a first etch product. The at least one oxidation process may include a first oxidation process to oxidize the first etch product attached on an etched side of the magnetic tunnel junction layer.

According to example embodiments, a fabricating method of a magnetic random access memory device includes forming a first interlayer dielectric layer including a contact plug on a substrate. A magnetic tunnel junction layer is formed by sequentially stacking a first magnetic layer, a tunnel dielectric layer, and a second magnetic layer on the first interlayer dielectric layer. A mask pattern is formed on a region of the second magnetic layer. A magnetic tunnel junction layer pattern and a sidewall dielectric layer pattern on at least one sidewall of the magnetic tunnel junction layer pattern is formed by performing at least one etch process and at least one oxidation process multiple times. The at least one etch process may include a first etch process to etch a portion of the magnetic tunnel junction layer using an inert gas and the mask pattern to form a first etch product. The at least one oxidation process may include a first oxidation process to oxidize the first etch product attached on an etched side of the magnetic tunnel junction layer.

According to example embodiments, a fabricating method of a magnetic tunnel junction structure includes forming a magnetic tunnel junction layer pattern and a sidewall dielectric layer pattern on at least one sidewall of the magnetic tunnel junction layer pattern by performing at least one etch process and at least one oxidation process multiple times.

BRIEF DESCRIPTION OF THE DRAWINGS

The above and other features and advantages of example embodiments will become more apparent by describing in detail example embodiments thereof with reference to the attached drawings in which.

DETAILED DESCRIPTION

Figure 1:
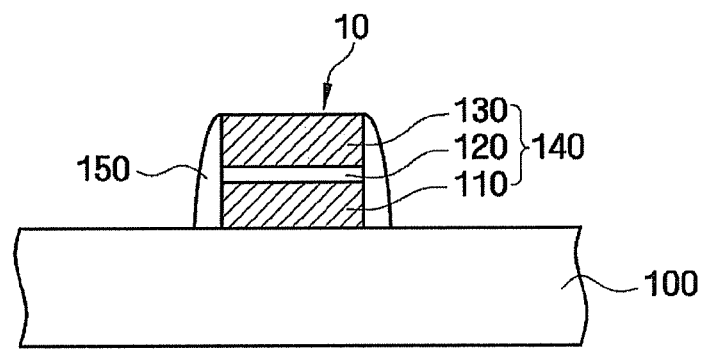
FIG. 1 is a sectional view illustrating a magnetic tunnel junction structure according to example embodiments.

Advantages and features of example embodiments and methods of accomplishing the same may be understood more readily by reference to the following detailed description of example embodiments and the accompanying drawings. Example embodiments may, however, be embodied in many different forms and should not be construed as being limited to the example embodiments set forth herein. Rather, these example embodiments are provided so that this disclosure will be thorough and complete and will fully convey the concept of example embodiments to those skilled in the art, and example embodiments will only be defined by the appended claims. In the drawings, the thickness of layers and regions are exaggerated for clarity.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments will be described with reference to perspective views, cross-sectional views, and/or plan views, in which example embodiments are shown. Thus, the profile of an example view may be modified according to manufacturing techniques and/or allowances. That is, example embodiments are not intended to limit the scope of the inventive concepts but cover all changes and modifications that can be caused due to a change in manufacturing process. Thus, regions shown in the drawings are illustrated in schematic form and the shapes of the regions are presented simply by way of illustration and not as a limitation.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that twins, such as those defined in commonly used dictionaries, should be interpreted as having a meaning that is consistent with their meaning in the context of the relevant art and will not be interpreted in an idealized or overly formal sense unless expressly so defined herein.

FIG. 1 is a sectional view illustrating a magnetic tunnel junction structure according to example embodiments. Referring to FIG. 1, a MTJ (Magnetic Tunnel Junction) structure 10 may include a magnetic tunnel junction layer pattern 140 including a first magnetic layer pattern 110, a tunnel dielectric layer pattern 120, and a second magnetic layer pattern 130 and a sidewall dielectric layer pattern 150 formed on the sidewalls of the magnetic tunnel junction layer pattern 140, all of which are formed on a substrate 100.

One of the first magnetic layer pattern 110 and the second magnetic layer pattern 130 can be a pinned ferromagnetic layer pattern having a fixed magnetic direction and the other can be a free ferromagnetic layer pattern having variable magnetic direction depending on a current direction applied to the magnetic tunnel junction layer pattern 140. The first magnetic layer pattern 110 and the second magnetic layer pattern 130 can be formed by using CoFe, NiFe, or CoFeB.

The tunnel dielectric layer pattern 120 can be formed with aluminum oxide or magnesium oxide.

The sidewall dielectric layer pattern 150 may be formed directly contacting the sidewalls of the magnetic tunnel junction layer pattern 140. The sidewall dielectric layer pattern 150 may be formed by oxidizing an etch product attached to the sidewalls of the magnetic tunnel junction layer pattern 140. The etch product may be created during an etch process to form the magnetic tunnel junction layer pattern 140. Thus, the sidewall dielectric layer pattern 150 may be formed with an oxidized substance where the substance is used to form the magnetic tunnel junction layer pattern 140. Although described later, the magnetic tunnel junction layer pattern 140 may be formed by perfoming two or more etch processes, and the sidewall dielectric layer pattern 150 may be formed by performing multiple oxidization processes where each oxidization process is executed after each etch process.

Figure 2:
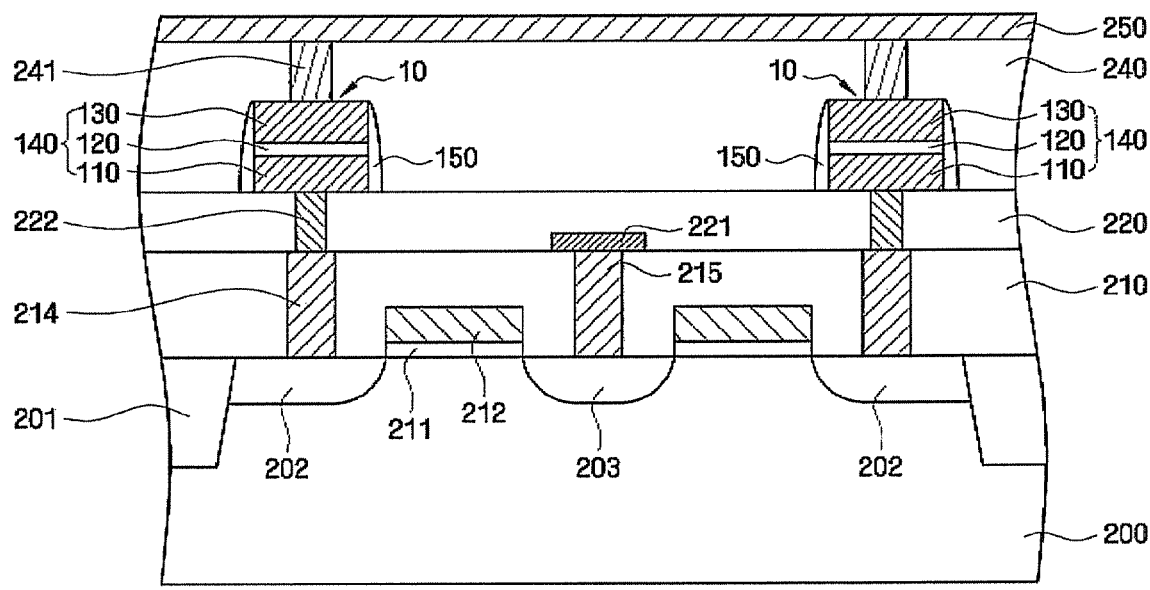
FIG. 2 is a sectional view illustrating a MRAM (Magnetic Random Access Memory) device according to example embodiments.

FIG. 2 is a sectional view illustrating a MRAM (Magnetic Random Access Memory) device according to example embodiments. The MRAM device illustrated in FIG. 2 is a STT (Spin Transfer Torque) MRAM device. The STT MRAM device uses a phenomenon where when high density current having an arranged spin direction enters the magnetic material, the magnetic direction of the magnetic material lines up in the direction of the current spin direction if the magnetic direction of the magnetic material is not the same as the current spin direction. Because STT MRAM device does not require digit lines, minimization or reduction of the MRAM device may be possible.

Referring to FIG. 2, an access device may be placed in a predetermined or given region of a substrate 200. The substrate 200 may be a silicon substrate, a gallium arsenide substrate, a SiGe substrate, a ceramic substrate, a quartz substrate, a glass substrate for display, or a SOI (Semiconductor On Insulator) substrate. The access device may be a MOS transistor. In this case, an access transistor may be placed in an active region limited by a device isolation layer 201 farmed in a predetermined or given region of the substrate 200. Specifically, the access transistor may be placed in the active region and may include a source region 203 and a drain region 202, separated from each other. A gate electrode 212 may be formed on the channel region between the source region 203 and the drain region 202. The gate electrode 212 may be extended across the top of the active region and serve as a word line. The gate electrode 212 may be electrically disconnected from the active region by a gate dielectric layer 211.

On the substrate 200 including the access transistor, a first interlayer dielectric layer 210 may be formed, and on a certain region of the first interlayer dielectric layer 210 corresponding to the source region 203, a source line 221 may be placed. The source line 221 may be formed to extend in the identical direction to the gate electrode 212. In FIG. 2, two adjacent access transistors share the source region 203; however, it is not limited thereto and two adjacent access transistors may not share the source region and the drain region.

In the first interlayer dielectric layer 210, a source line contact plug 215 that connects the source line 221 to the source region 203 electrically and a landing contact plug 214 formed on the drain region 202 may be formed.

On the first interlayer dielectric layer 210 where the source line 221 is placed, a second interlayer dielectric layer 220 may be formed. In the second interlayer dielectric layer 220, a lower electrode contact plug 222 electrically connected to the landing contact plug 214 formed on the drain region 202 may be formed.

On the second dielectric layer 220, a magnetic tunnel junction structure 10 including a magnetic tunnel junction layer pattern 140 and a sidewall dielectric layer pattern 150 may be placed. The magnetic tunnel junction layer pattern 140 may include a first magnetic layer pattern 110, a tunnel dielectric layer pattern 120, and a second magnetic layer pattern 130 sequentially stacked on the second interlayer dielectric layer 220. Because the magnetic tunnel junction structure 10 is identical to the magnetic tunnel junction structure according to example embodiments illustrated in FIG. 1, detailed descriptions are omitted.

The magnetic tunnel junction layer pattern 140 and the drain region 202 may be electrically connected through the landing contact plug 214 and the lower electrode contact plug 222. On the substrate 200 where the magnetic tunnel junction structure 10 is placed, a third interlayer dielectric layer 240 may be formed. On the third interlayer dielectric layer 240, a bit line 250 may be placed to cross with the gate electrode 212. The bit line 250 and the magnetic tunnel junction layer pattern 140 may be electrically connected through an upper electrode contact plug 241.

The first, second, and third dielectric layers 210, 220, and 240, for example, may be formed with a silicon oxide layer or a silicon oxynitride layer. The landing contact plug 214, the source line contact plug 215, the source line 221, the lower electrode contact plug 222, the upper electrode contact plug 241, and the bit line 250, for example, may be formed by using W, Ru, Ta, Cu, Al, or doped polysilicon. On the bit line 250, metal interconnects can be formed additionally to connect circuits of peripheral circuit unit (not shown) electrically.

Figure 3:
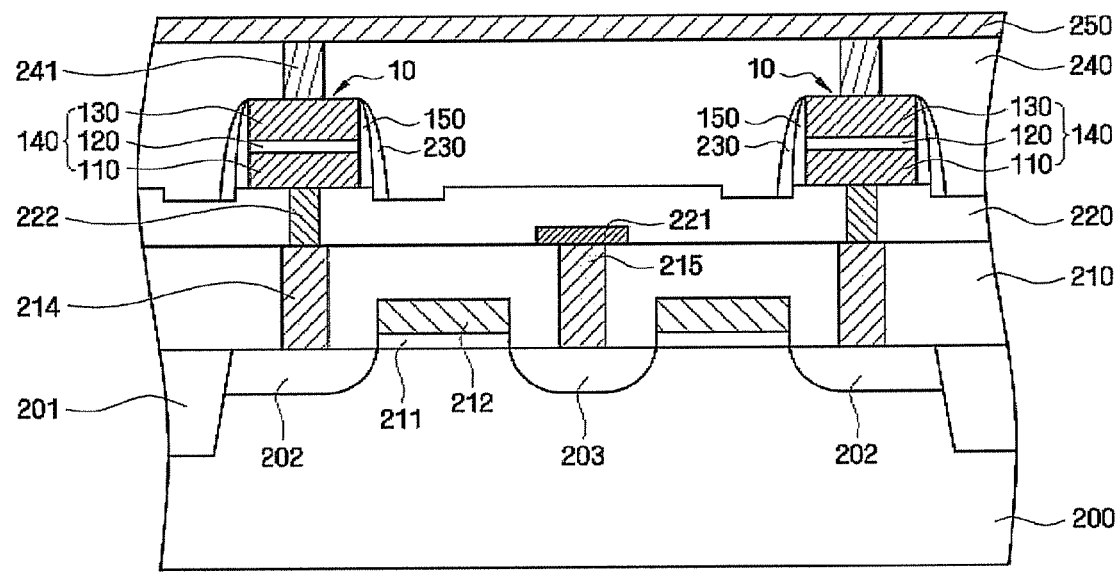
FIG. 3 is a sectional view illustrating a MRAM (Magnetic Random Access Memory) device according to example embodiments.

FIG. 3 is a sectional view illustrating a MRAM device according to example embodiments. Referring to FIG. 3, the MRAM device according to example embodiments is different from the MRAM device according to an example embodiment illustrated in FIG. 2 such that a sidewall protection layer pattern 230 is formed additionally on a sidewall dielectric layer pattern 150. The sidewall protection layer pattern 230 may be formed by having an etch product attached on the sidewall dielectric layer pattern 150. The etch product may be created by etching a portion of the second interlayer dielectric layer 220 located around the magnetic tunnel junction structure 10. In a certain region of the second interlayer dielectric layer 220 located around the magnetic tunnel junction structure 10, a recess can be formed. The sidewall protection layer pattern 230 can be formed to directly contact to the sidewall dielectric layer pattern 150.

Figure 4:
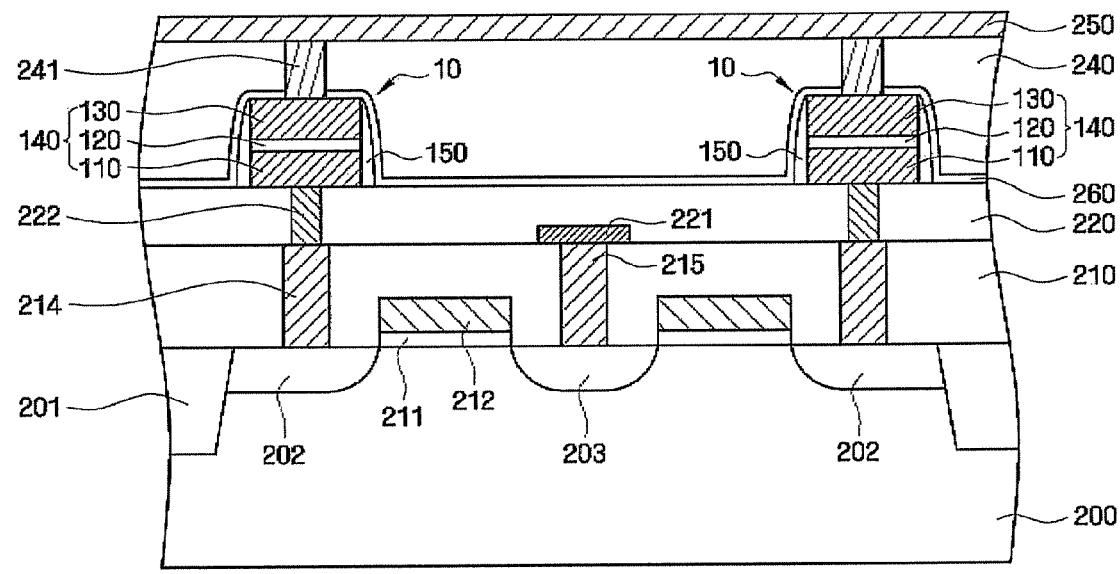
FIG. 4 is a sectional view illustrating a MRAM (Magnetic Random Access Memory) device according to example embodiments.

FIG. 4 is a sectional view illustrating a MRAM device according to example embodiments. Referring to FIG. 4, the MRAM device according to example embodiments is different from the MRAM device according to an example embodiment illustrated in FIG. 2 such that a protection layer 260 is formed conformally along a second interlayer dielectric layer 220 and a magnetic tunnel junction structure 10 is included.

Referring to FIGS. 1 and 5 through 9, a fabrication method of a magnetic tunnel junction structure according to example embodiments is described. FIGS. 5 through 9 are sectional views illustrating a fabrication method of a magnetic tunnel junction structure according to example embodiments in order.

Figure 5:
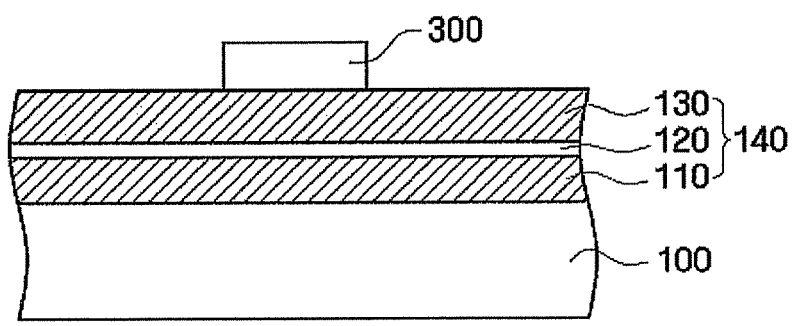
FIGS. 5 through 9 are sectional views illustrating a fabrication method of a magnetic tunnel junction structure according to example embodiments.

Referring to FIG. 5, on a substrate 100, a first magnetic layer 111, a tunnel dielectric layer 121, a second magnetic layer 131 are sequentially stacked to faun a magnetic tunnel junction layer 141. The first magnetic layer 111 and the second magnetic layer 131 can be formed by using CoFe, NiFe, or CoFeB, and the tunnel dielectric layer 121 can be formed by using aluminum oxide or magnesium oxide. On a certain region of the second magnetic layer 131, a mask pattern 300 may be formed.

Figure 6:
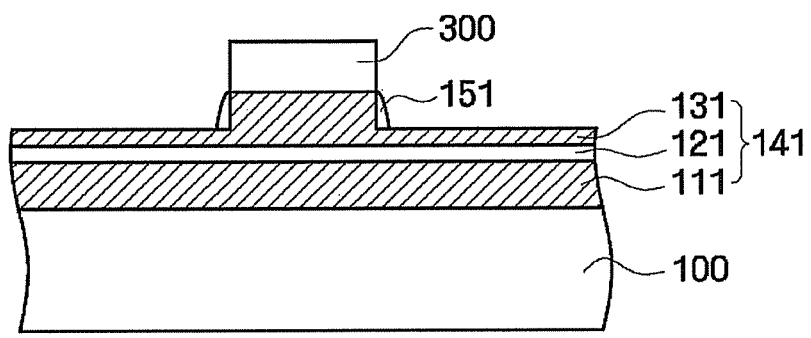

Referring to FIG. 6, by using the mask pattern 300 as an etch mask pattern, a first etch process which etches a part of the magnetic tunnel junction layer 141, for example, part of the second magnetic layer 131, may be performed. For etching the magnetic tunnel junction layer 141, a physical etch that uses inert gas is used.

When etching the magnetic tunnel junction layer 140 using a physical etch that uses inert gas, a part of a material composing the magnetic tunnel junction layer 141 which is removed by the etch is attached on an etched side of the magnetic tunnel junction layer 141. Thus, an etch product 151 created by the first etch process may be attached to an etched side of the magnetic tunnel junction layer 141.

Figure 7:
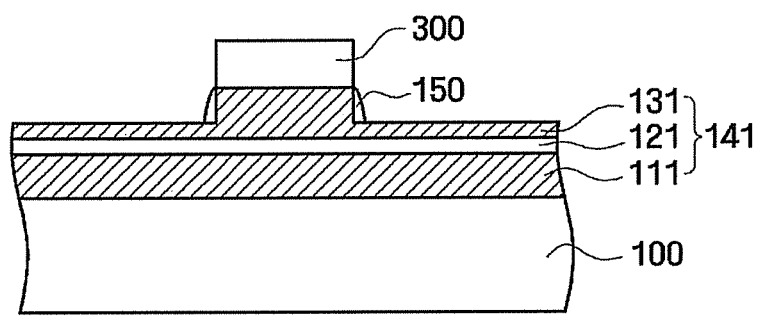

Referring to FIGS. 6 and 7, a first oxidation process may be performed to oxidize the etch product 151 attached to the etched side of the magnetic tunnel junction layer 141. Using the first oxidation process, the etch product 151 attached to the etched side of the magnetic tunnel junction layer 141 may be used to form a sidewall dielectric layer pattern 150 having dielectric characteristics.

Figure 8:
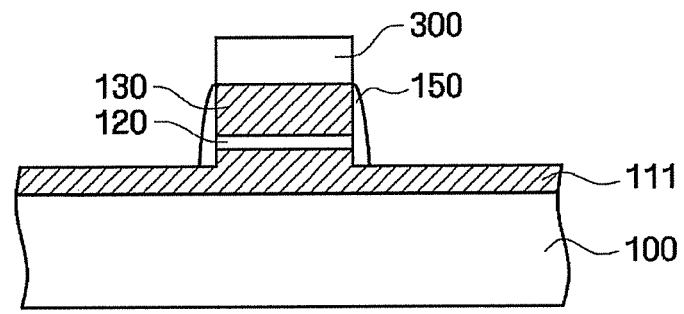

Referring to FIGS. 7 and 8, a second etch process may be performed to etch a part of the magnetic tunnel junction layer not etched by the first etch process. During the second etch process, for example, a remainder of the second magnetic layer 131, a part of the tunnel dielectric layer 121 and a part of the first magnetic layer 111 can be etched. The second etch process forms a second magnetic layer pattern 130 using the second magnetic layer 131 and a tunnel dielectric layer pattern 120 using the tunnel dielectric layer 121. The etch product created by the second etch process may be attached on the etched side of the magnetic tunnel junction layer, for example, a sidewall of the second magnetic layer pattern 130, a sidewall of the tunnel dielectric layer pattern 120, and a sidewall of the etched first magnetic layer 111.

By performing the second oxidation process to oxidize the etch product created during the second etch process and attached on the etched side of the magnetic tunnel junction layer, a sidewall dielectric layer pattern 150 may be formed along the sidewall of the second magnetic layer pattern 130, the sidewall of the tunnel dielectric layer pattern 120, and the sidewall of the etched first magnetic layer 111.

Figure 9:
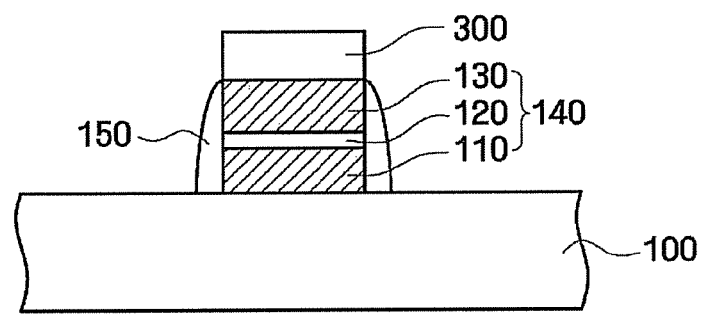

Referring to FIGS. 8 and 9, a third etch process may be performed to etch a remainder of the magnetic tunnel junction layer not etched by the second etch process. The third etch process forms a first magnetic layer pattern 110 using the first magnetic layer 111. The magnetic tunnel junction layer pattern 140 includes the first magnetic layer pattern 110, the tunnel dielectric pattern 120, and the second magnetic layer pattern 130. The etch product created by the third etch process may be attached on the etched side of the magnetic tunnel junction layer, for example, the sidewall of the magnetic tunnel junction layer pattern 140.

By performing a third oxidation process to oxidize the etch product created by the third etch process and attached on the sidewall of the magnetic tunnel junction layer pattern 140, the sidewall dielectric layer pattern 150 may be formed on the sidewall of the etched first magnetic layer pattern 110.

The first through the third etch processes described above are physical etch processes that utilize inert gas. For inert gas, $NH_3$ gas can be used. Also, $NH_3$ gas mixed with CO gas or $SF_6$ gas can be used. The first through the third oxidation processes described above can use a radical oxidation process or a plasma oxidation process. Also, the first through the third oxidation processes can be performed at a power below about 200 W.

In example embodiments, the etch process to etch the part of the magnetic tunnel junction layer (141 of FIG. 5) may be performed immediately followed by the oxidation process to oxidize the etch product attached on the sidewall of the magnetic tunnel junction layer 141, an etch process to etch the part of the magnetic tunnel junction layer 141 not etched after the oxidation process, and another oxidation process to oxidize the etch product created by the etch processes. Thus, the etch and oxidation process set including an etch process and an oxidation process following the etch process is performed multiple times. In example embodiments, because the etch and oxidation process set is performed multiple times, the oxidation rate of each oxidation process can be adjusted. When the oxidation process is performed under a high power condition, the magnetic tunnel junction layer pattern (140 of FIG. 9), specifically the dielectric layer pattern (120 of FIG. 9), can be damaged.

However, in example embodiments, after an etch process to etch only the part of the magnetic tunnel junction layer (141 of FIG. 5), the oxidation process may be performed to oxidize only the etch product (151 of FIG. 5) created by the etch process. As a result, each oxidation process can be performed under less than about 200 W, which is the power level not to damage the magnetic tunnel junction layer pattern (140 of FIG. 9), especially the dielectric layer pattern (120 of FIG. 9). On the other hand, where the magnetic tunnel junction layer (141 of FIG. 5) is patterned by performing one etch process and then the etch product created by the etch process is oxidized by perfolining one oxidation process, the oxidation process needs to be performed under a high power level of greater than about 200 W. As a result, such an oxidation process can damage the magnetic tunnel junction layer pattern (140 of FIG. 9), especially the dielectric layer pattern (120 of FIG. 9).

Also, each oxidation process performed after each etch process can be performed in-situ. When the etch process and oxidation process are performed in-situ, corrosion and deterioration of the magnetic tunnel junction structure due to air can be prevented or reduced.

For example, the tunnel dielectric layer (121 of FIG. 5) may be etched by performing an etch process one time. Thus, each etch process may be required not to end on the tunnel dielectric layer 121. If an $n^{th}$ etch process is finished after etching only a part of the tunnel dielectric layer 121, part of the tunnel dielectric layer 121 can be exposed during the $n^{th}$ oxidation process. In example embodiments, the characteristics of the tunnel dielectric layer 121 can be deteriorated due to $n^{th}$ oxidation process. Therefore, to prevent or reduce the tunnel dielectric layer 121 from exposure during oxidation process, the tunnel dielectric layer (121 of FIG. 5) may be etched by performing the etch process one time.

The etch product created during the etch process of the magnetic tunnel junction layer (141 of FIG. 5) has conductivity. When such an etch product is attached on the magnetic tunnel junction layer pattern (140 of FIG. 9), resistance distribution characteristics of the magnetic tunnel junction layer pattern 140 may be deteriorated. However, in example embodiments, because the sidewall dielectric layer pattern (150 of FIG. 9) is formed by oxidizing such an etch product, shorts between the first magnetic layer pattern 110 and the second magnetic layer pattern 130 of the magnetic tunnel junction layer pattern 140 can be prevented or reduced. Also, deterioration of resistance distribution characteristics of the magnetic tunnel junction layer pattern 140 can be prevented or reduced, and an additional capping layer or protection layer to prevent or reduce shorts between the first magnetic layer pattern 110 and the second magnetic layer pattern 130 of the magnetic tunnel junction layer pattern 140 may not be needed. As a result, the process can be simplified and cost can be reduced.

In example embodiments, the magnetic tunnel junction structure may be formed by performing etch and oxidation processes three times, but example embodiments are not limited thereto. The magnetic tunnel junction structure can be formed by performing the etch and oxidation processes two or four times. Referring to FIGS. 9 and 1, by removing the mask pattern 300, the magnetic tunnel junction structure 10 is completed.

Referring to FIGS. 2 and 10 through 14, a fabrication method of a magnetic tunnel junction structure according to example embodiments is described. FIGS. 10 through 14 are sectional views sequentially illustrating a fabrication method of a MRAM device according to example embodiments.

Figure 10:
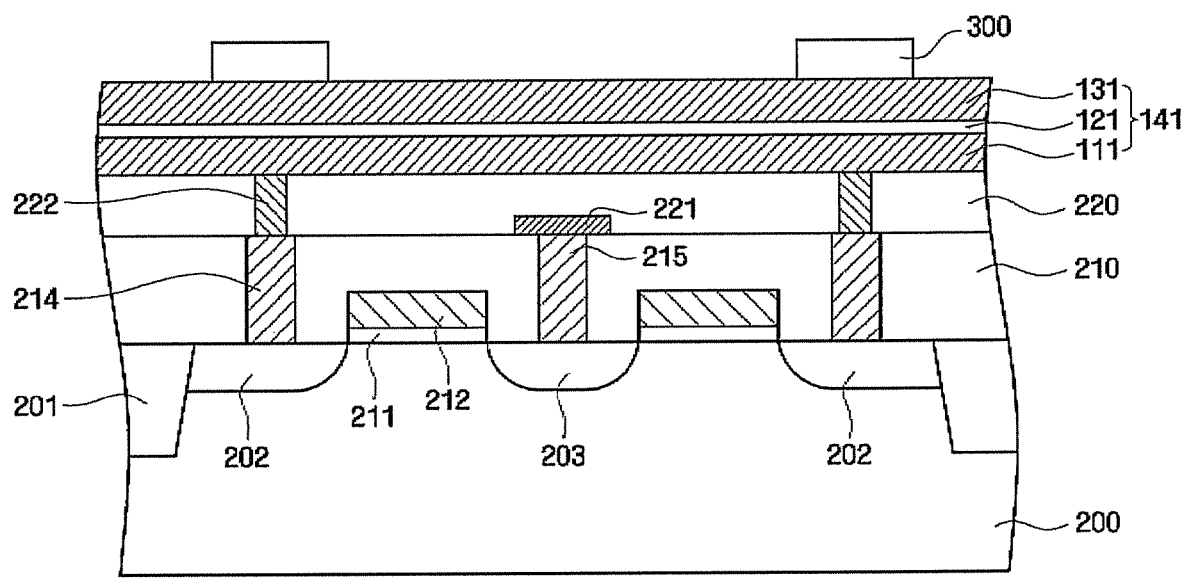
FIGS. 10 through 14 are sectional views illustrating a fabrication method of a MRAM (Magnetic Random Access Memory) device according to example embodiments.
Figure 11:
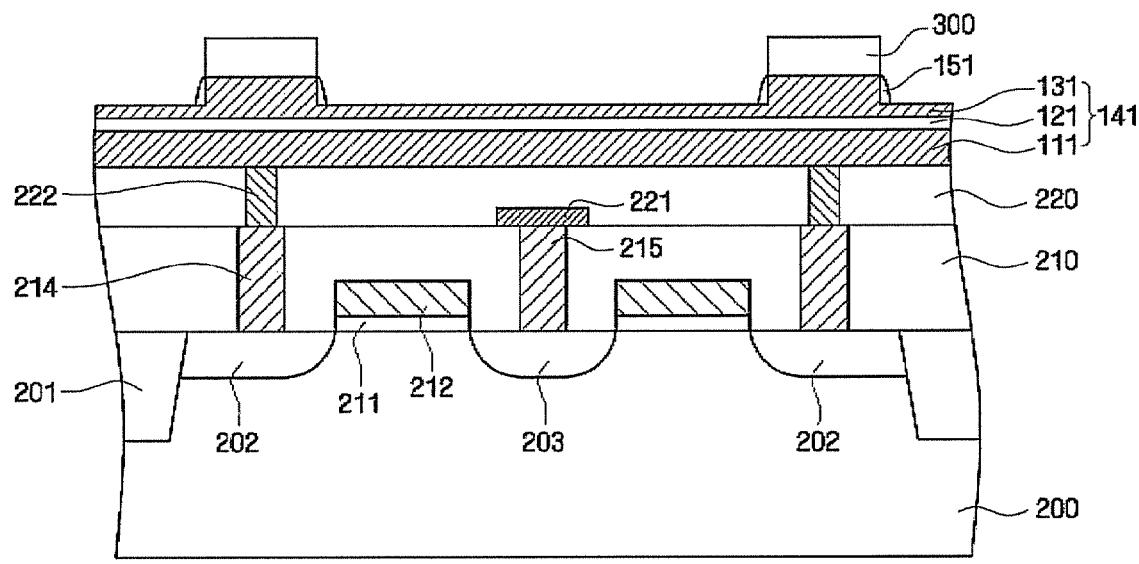
Figure 12:
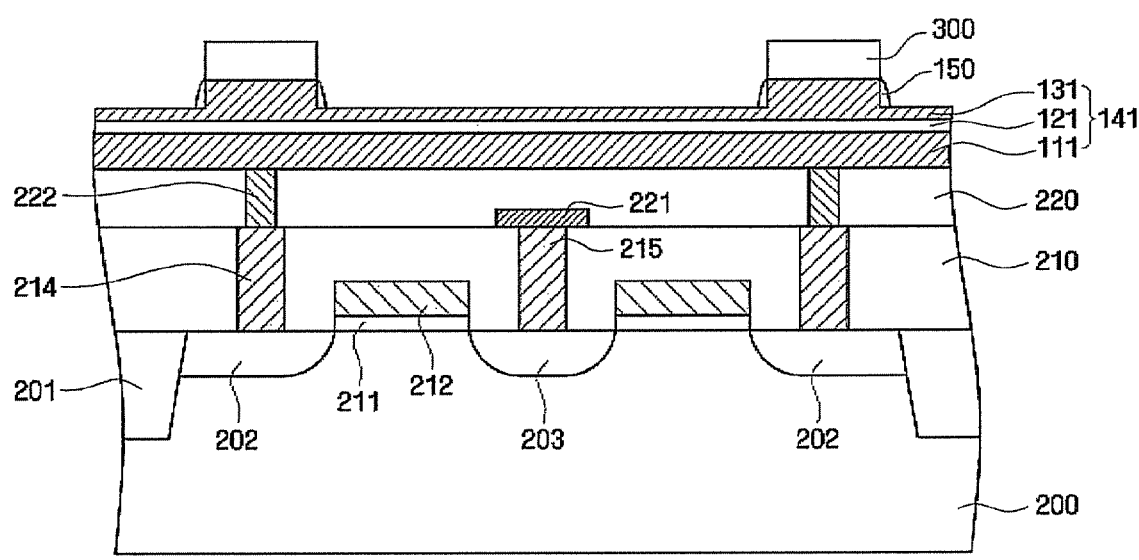
Figure 13:
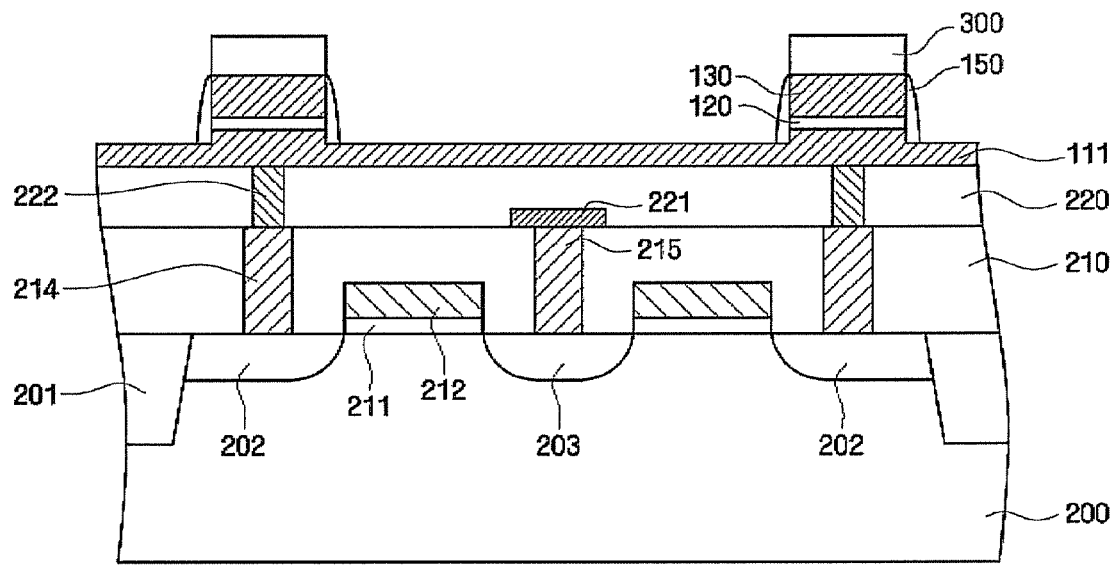

Referring to FIG. 10, in a substrate 200, for example, by an using STI (Shallow Trench Isolation) method, a device isolation layer 201 that defines an active region may be formed. On the active region, a gate dielectric layer 211 and a gate electrode 212 are formed. By implanting (or doping) impurities in the active region of the substrate 200 exposed by a gate electrode 212, a source region 203 and a drain region 202 are formed.

On the substrate 200 where the gate electrode 212 is formed, a first interlayer dielectric layer 210 may be formed. To expose a predetermined or given region of the drain region 202 and the source region 203, a predetermined or given region of the first interlayer dielectric layer 210 may be etched to form a contact hole, and a landing contact plug 214 and a source line contact plug 215 that fill the contact hole may be formed.

On the source line contact plug 215, a source line 221 connected to the source line contact plug 215 electrically may be formed. On the entire substrate 200 where the source line 221 is formed, a second interlayer dielectric layer 220 may be formed.

To expose a predetermined or given region of the landing contact plug 214, a predetermined or given region of the second interlayer dielectric layer 220 may be removed to form a contact hole, and a lower electrode contact plug 222 that fills the contact hole may be formed.

On the substrate 200 where the lower electrode contact plug 222 is formed, a first magnetic layer 111, a tunnel dielectric layer 121, and a second magnetic layer 131 may be sequentially stacked to form a magnetic tunnel junction layer 141. On a predetermined or given region of the second magnetic layer 131, a mask pattern 300 may be formed.

Referring to FIGS. 11 through 14, by performing an etch and oxidation process set including an etch process to etch part of the magnetic tunnel junction layer 141 by using the mask pattern as an etch mask pattern and an oxidation process to oxidize the etch product 151 created by the etch process multiple times, for example, 3 times, a magnetic tunnel junction layer pattern 140 and a sidewall dielectric layer pattern 150 formed on sidewalls of the magnetic tunnel junction layer pattern 140 may be formed.

Figure 14:
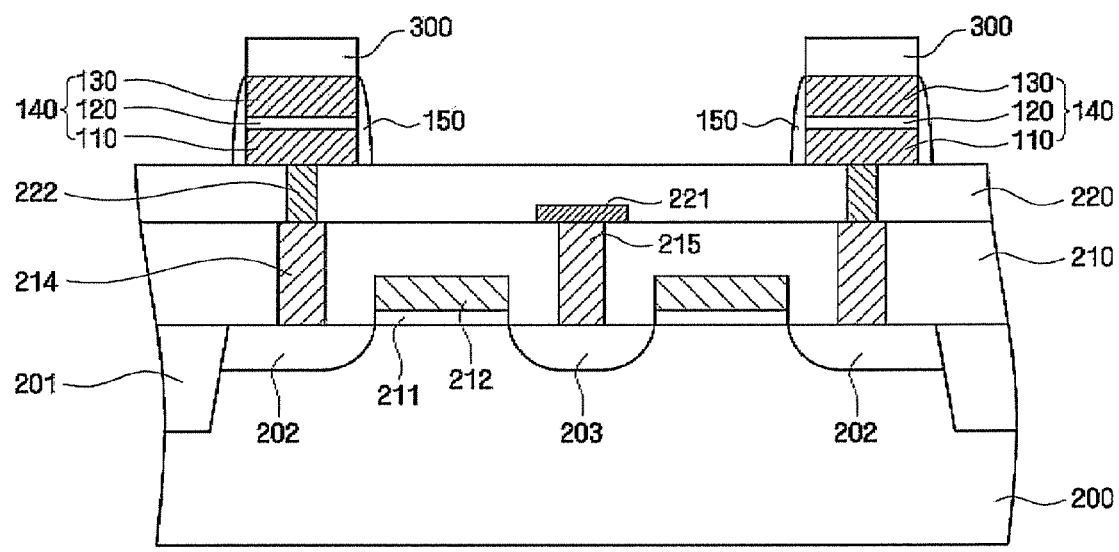

Referring to FIGS. 14 and 2, after removing the mask pattern 300, on the substrate 200 where the magnetic tunnel junction structure 10 is formed, a third interlayer dielectric layer 240 may be formed. After forming a contact hole by removing part of the third interlayer dielectric layer 240 to expose the second magnetic layer pattern 130 partially, an upper electrode contact plug 241 that fills the contact hole may be formed. On the third interlayer dielectric layer 240, a bit line 250 which is across the gate electrode 121 may be formed.

Figure 15:
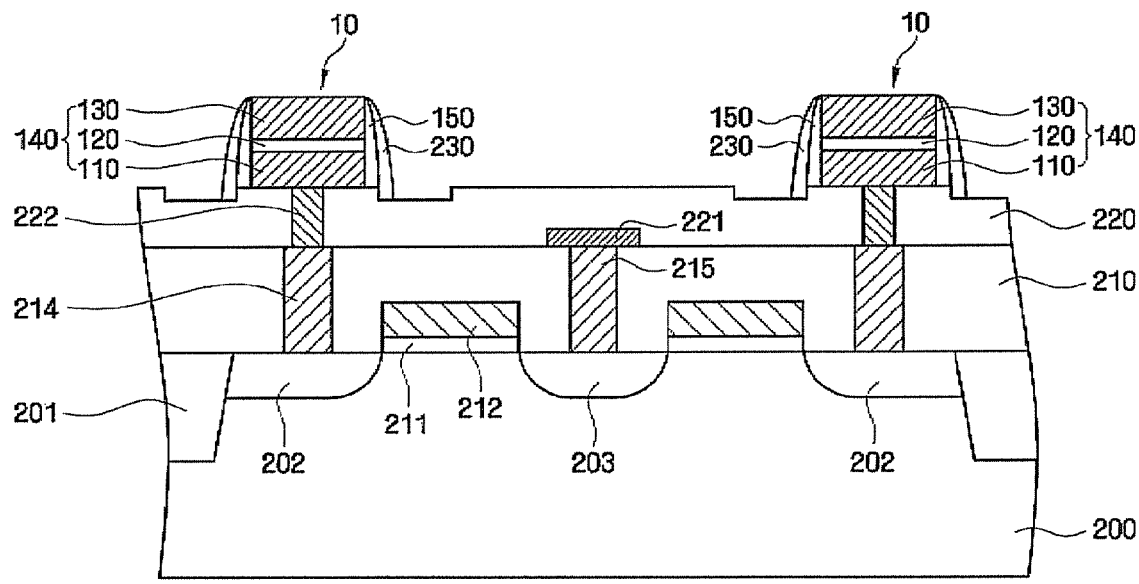
FIG. 15 is a sectional view illustrating an intermediate step of fabricating a MRAM device according to example embodiments.

Referring to FIGS. 3 and 10 through 15, a fabrication method of a MRAM device according to example embodiments is described. FIG. 15 is a sectional view illustrating an intermediate step of fabricating a MRAM device according to example embodiments. As mentioned in FIGS. 10 through 14, on a second interlayer dielectric layer 220, a magnetic tunnel junction structure 10 may be formed.

Referring to FIG. 15, by using the magnetic tunnel junction structure 10 as an etch mask pattern, a part of a second interlayer dielectric layer 220 placed around the magnetic tunnel junction structure 10 may be etched. A physical etch that uses inert gas is used for the etch. The second interlayer dielectric layer 220 may be etched by using a physical etch that uses inert gas, and part of the second interlayer dielectric layer 220 material removed by the etch may be attached on a sidewall dielectric pattern 150. As a result, a sidewall protection pattern 230 may be formed on the sidewall dielectric pattern 150. Because the second interlayer dielectric layer 220 is formed with dielectric material including silicon oxide and silicon oxynitride, the sidewall protection pattern 230 formed with the etch product created by the etch of the second interlayer dielectric layer 220 may have dielectric characteristics.

After forming the sidewall protection pattern 230 and to solidify the sidewall protection pattern 230 further, an ashing process using oxygen gas or oxygen plasma treatment can be performed additionally.

Referring to FIGS. 15 and 3, after removing the mask pattern 300 on the substrate 200 where the magnetic tunnel junction structure 10 and the sidewall protection pattern 230 are formed, a third interlayer dielectric layer 240, an upper electrode contact plug 241, and a bit line 250 are formed.

Figure 16:
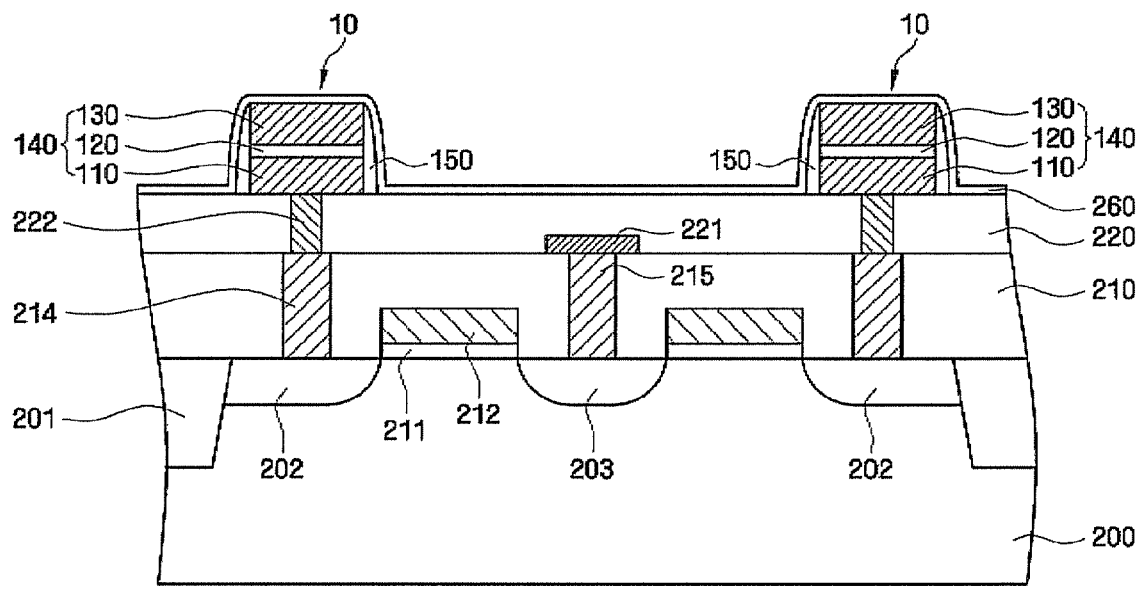
FIG. 16 is a sectional view illustrating an intermediate step of fabricating a MRAM device according to example embodiments.

Referring to FIGS. 4, 10 through 14, and 16, a fabrication method of a MRAM device according to example embodiments is described. FIG. 16 is a sectional view illustrating an intermediate step of fabricating a MRAM device according to example embodiments.

As mentioned in FIGS. 10 through 14, a magnetic tunnel junction structure 10 may be formed on a second interlayer dielectric layer 220. Referring to FIG. 16, a protection layer 260 may be formed along the second interlayer dielectric layer 220 and the magnetic tunnel junction structure 10 conformally. The protection layer 260 can be formed by using a silicon oxide layer, a silicon oxynitride layer, or a silicon nitride layer.

Referring to FIGS. 16 and 4, after removing a mask pattern 300, a third interlayer dielectric layer 240, an upper electrode contact plug 241, and a bit line 250 may be formed on a substrate 200 where the magnetic tunnel junction structure 10 and the protection layer 260 are formed.

In concluding the detailed description, those skilled in the art will appreciate that many variations and modifications can be made to example embodiments without substantially departing from the principles of example embodiments. Therefore, the disclosed example embodiments are used in a generic and descriptive sense only and not for purposes of limitation.

What is claimed is:

1. A method of fabricating a magnetic tunnel junction structure, the method comprising:
   forming a magnetic tunnel junction layer by sequentially stacking a first magnetic layer, a tunnel dielectric layer, and a second magnetic layer on a substrate;
   forming a mask pattern on a region of the second magnetic layer;
   forming a magnetic tunnel junction layer pattern and a sidewall dielectric layer pattern on at least one sidewall of the magnetic tunnel junction layer pattern by performing at least one etch process and at least one oxidation process multiple times,
   the at least one etch process including a first etch process to etch a portion of the magnetic tunnel junction layer using the inert gas and the mask pattern to form a first etch product,
   the at least one oxidation process including a first oxidation process to oxidize the first etch product attached on the etched side of the magnetic tunnel junction layer,
   the at least one etch process further including a second etch process to etch a portion of the magnetic tunnel iunction layer not etched by the first etch process to form a second etch product,
   the at least one oxidation process including a second oxidation process to oxidize the second etch product formed by the second etch process,
   wherein, the at least one etch process etches a part of the magnetic tunnel junction layer pattern by using an inert gas, and the at least one oxidation process oxidizes a product created by the at least one etch process to form the sidewall dielectric layer pattern.

2. The method of claim 1, wherein the inert gas includes NH3 gas.

3. The method of claim 2, wherein the inert gas further includes at least one of CO gas and $SF_6$ gas.

4. The method of claim 1, wherein the at least one etch process and the at least one oxidation process are performed in-situ.

5. The method of claim 1, wherein the at least one oxidation process is performed by using power below about 200 W.

6. The method of claim 1, wherein the at least one oxidation process is at least one of a radical oxidation process and a plasma oxidation process.

7. The method of claim 1, wherein the tunnel dielectric layer is etched by the second etch process.

8. A method of fabricating a magnetic random access memory device, the method comprising:
   fabricating a magnetic tunnel junction structure according to the method of claim 1, the fabricating the magnetic tunnel structure including,
   forming a first interlayer dielectric layer including a contact plug on the substrate before the forming magnetic tunnel junction layer pattern and the sidewall dielectric layer pattern, and
   forming the magnetic tunnel junction layer by sequentially stacking the first magnetic layer, the tunnel dielectric layer, and the second magnetic layer on the first interlayer dielectric layer before the forming magnetic tunnel junction layer pattern and the sidewall dielectric layer pattern.

9. The method of claim 8, after forming the magnetic tunnel junction layer pattern and the sidewall dielectric layer pattern, further comprising:
   forming a sidewall protection layer pattern on the sidewall dielectric layer pattern by etching a portion of the first interlayer dielectric layer around the sidewall dielectric layer pattern using the sidewall dielectric layer pattern.

10. The method of claim 9, wherein etching the portion of the first interlayer dielectric layer includes using the inert gas.

11. The method of claim 9, after forming the sidewall protection layer pattern, further comprising:

performing an ashing process on the sidewall protection layer pattern, the ashing process including at least one treatment using an oxygen gas or an oxygen plasma.

12. The method of claim 8, further comprising:
forming a protection layer conformally on the first interlayer dielectric layer, the magnetic tunnel junction layer pattern, and the sidewall dielectric layer pattern.

13. The method of claim 8, wherein the contact plug and the first magnetic layer are in direct contact with each other.

14. The method of claim 8, further comprising:
forming a second interlayer dielectric layer on the first interlayer dielectric layer; and
forming a bit line on the second interlayer dielectric layer.

15. The method of claim 8, wherein the inert gas includes $NH_3$ gas.

16. The method of claim 8, wherein the at least one oxidation process is performed by using power below about 200 W.

17. The method of claim 1, wherein the forming the magnetic tunnel junction layer pattern and the sidewall dielectric layer pattern includes forming the sidewall dielectric layer pattern along an entire surface of the at least one sidewall of the magnetic tunnel junction layer pattern.

* * * * *